(12) United States Patent
Koh et al.

(10) Patent No.: US 9,431,144 B2
(45) Date of Patent: Aug. 30, 2016

(54) INDIUM-CONTAINING OXIDE FILM AND PREPARING METHOD THEREOF

(71) Applicant: UP CHEMICAL CO., LTD., Pyeongtaek-si (KR)

(72) Inventors: Wonyong Koh, Daejeon (KR); Byungsoo Kim, Daejeon (KR); Dong Hwan Ma, Seoul (KR)

(73) Assignee: UP Chemical Co., Ltd., Pyeongtaek-si (KR)

( * ) Notice: Subject to any disclaimer, the term of this patent is extended or adjusted under 35 U.S.C. 154(b) by 0 days.

(21) Appl. No.: 14/339,640

(22) Filed: Jul. 24, 2014

(65) Prior Publication Data
US 2014/0335363 A1 Nov. 13, 2014

Related U.S. Application Data

(63) Continuation of application No. PCT/KR2013/000678, filed on Jan. 28, 2013.

(30) Foreign Application Priority Data

Jan. 27, 2012 (KR) .................. 10-2012-0008340
Nov. 7, 2012 (KR) .................. 10-2012-0125552
Jan. 28, 2013 (KR) .................. 10-2013-0009168

(51) Int. Cl.
*C23C 16/00* (2006.01)
*H01B 1/08* (2006.01)
(Continued)

(52) U.S. Cl.
CPC .............. *H01B 1/08* (2013.01); *C23C 14/086* (2013.01); *C23C 16/06* (2013.01); *C23C 16/40* (2013.01);
(Continued)

(58) Field of Classification Search
CPC ........ H01B 1/08; C23C 14/086; C23C 16/06; C23C 16/407; C23C 16/40; C23C 16/45531; G02F 1/13439
USPC ...................... 427/255.23–255.395
See application file for complete search history.

(56) References Cited

U.S. PATENT DOCUMENTS

| | | | | |
|---|---|---|---|---|
| 4,880,492 | A | * | 11/1989 | Erdmann et al. ............ 422/245.1 |
| 2007/0234949 | A1 | * | 10/2007 | Ahn et al. ..................... 117/949 |
| 2011/0206846 | A1 | | 8/2011 | Elam et al. |

FOREIGN PATENT DOCUMENTS

| CN | 101543146 A | 9/2009 |
|---|---|---|
| JP | H04-276078 A | 10/1992 |

(Continued)

OTHER PUBLICATIONS

"Pulsed Laser Deposition of Transparent Conducting Indium Tin Oxide Films in Magnetic Field Perpendicular to Plume", Suzuki et al, Jpn. J. Appl. Phys. vol. 40 (2001) pp. L401-L403, Part 2, No. 4B, Apr. 15, 2001.*

(Continued)

*Primary Examiner* — Michael Wieczorek
*Assistant Examiner* — Michael G Miller
(74) *Attorney, Agent, or Firm* — Greer Burns & Crain Ltd.

(57) ABSTRACT

The present invention relates to an indium oxide film formed by chemical vapor deposition or atomic layer deposition, or to an oxide film containing indium, and to a method for forming same. By chemical vapor deposition or atomic layer deposition, wherein an indium material that is a liquid at room temperature is used, an oxide film containing indium can be formed on a substrate having a large area, and particularly a substrate for manufacturing a display device.

10 Claims, 2 Drawing Sheets

(51) Int. Cl.
- C23C 16/40 (2006.01)
- C23C 14/08 (2006.01)
- C23C 16/06 (2006.01)
- C23C 16/455 (2006.01)
- G02F 1/1343 (2006.01)

(52) U.S. Cl.
CPC ....... C23C 16/407 (2013.01); C23C 16/45531 (2013.01); C23C 16/45553 (2013.01); G02F 1/13439 (2013.01)

(56) References Cited

FOREIGN PATENT DOCUMENTS

| | | |
|---|---|---|
| JP | H08-264021 A | 10/1996 |
| JP | 09-050711 A | 2/1997 |
| JP | 2003-016858 | 1/2003 |
| JP | 2007-254298 A | 10/2007 |
| JP | 2008-513601 A | 5/2008 |
| JP | 2008-268400 A | 11/2008 |
| KR | 10-2008-0068228 | 7/2008 |
| KR | 10-2009-00069886 | 7/2009 |
| WO | WO 00/63956 | 10/2000 |
| WO | WO 2010/024279 A1 | 3/2010 |
| WO | WO 2010/035313 A1 | 4/2010 |
| WO | WO 2010/090740 A1 | 8/2010 |

OTHER PUBLICATIONS

Porchia et al, "Diethylindium(III) derivatives: synthesis and characterization of diethylindium(III) dialkylamides and diethylindium(III) pyrrolide. X-Ray crystal structures of diethylindium(III) pyrrolide and diethylindium(III) bromide", copyright 1992, Elsevier Sequoia S.A., Lausanne, Journal of Organometallic Chemsitry, 424 (1992) 1-13.*

Int'l. Search Report issued in Int'l. App. No. PCT/KR2013/000678, mailed May 14, 2013.

Yuzo Shigesato et al., "Electrical and structural properties of low resistivity tin-doped indium oxide films", J. Appl. Phys. 71, 3356 (1992).

Radhouane Bel Hadj Tahar et al., "Tin doped indium oxide thin films: Electrical properties". Journal of Applied Physics, vol. 83. No. 5. Mar. 1, 1998.

J. W. Elam et al., "Atomic Layer Deposition of In2O3 Using Cyclopentadienyl Indium: A New Synthetic Route to Transparent Conducting Oxide Films", Chemistry of Materials, vol. 18, p. 3571 (2006).

J. W. Elam et al., "Atomic Layer Deposition of Indium Tin Oxide Thin Films Using Nonhalogenated Precursors", Journal of Physical Chemistry C, vol. 112, p. 1938 (2008).

M. Ritala et al., "Enhanced Growth Rate in Atomic Layer Epitaxy of Indium Oxide and Indium—Tin Oxide Thin Films" Electrochemical and Solid-State Letters. vol. 1, p. 156 (1998).

Mikko Rit et al., "ALE Growth of Transparent Conductors", Material Research Society Symposium Proceedings, vol. 426, p. 513 (1996).

O. Nielsen et al., "Thin films of In2O3 by atomic layer deposition using In(acac)3" Thin Solid Films. vol. 517. p. 6320 (2009).

A. W. Ott et al., "Surface chemistry of In2O3 deposition using In(CH3)3 and H2O in a binary reaction sequence", Applied Surface Science. vol. 112. p. 205 (1997).

J.-H. Park et al., "The X-ray single crystal structure of [Me2In(acac)]2 and its use as a single-source precursor for the deposition of indium oxide thin films", Journal of Materials Chemistry, vol. 11, p. 2346 (2001).

D. W. Sheel and J. M. Gaskell, "Deposition of fluorine doped indium oxide by atmospheric pressure chemical vapour deposition", Thin Solid Films, vol. 520, p. 1242 (2011).

S. T. Barry et al., "Chemical vapour deposition of In2O3 thin films from a tris-guanidinate indium precursor", Dalton Transactions, vol. 40, p. 9425 (2011).

EP Search Report issued in EP App. No. 13 74 1343.1, dated Dec. 17, 2015.

Suzuki et al., "Pulsed laser deposition of transparent conducting indium tin oxide films in magnetic field perpendicular to plume", Japanese Journal of Applied Physics, vol. 40, No. 4B, Part 02, Apr. 15, 2001, pp. L401-L403.

Porchia et al., "Diethylindium(III) derivatives: synthesis and characterization of diethylindium(III) dialkylamides and diethylindium(III) pyrrolide, X-Ray crystal structures of diethylindium(III) pyrrolide and diethylindium(III) bromide", Journal of Organometallic Chemistry, vol. 424, No. 1, Feb. 1, 1992, pp. 1-13.

Hostalek et al., "Novel organometallic starting materials for group III-V semiconductor metal-organic chemical vapour deposition", Thin Solid Films, vol. 174, Jul. 1, 1989, pp. 1-4.

Molassioti et al., "Growth of indium phosphide by metalorganic vapor phase epitaxy using dimethyl (3-dimethylanunopropyl) indium as a new indium source", Applied Physics Letters, vol. 54, No. 9, Feb. 27, 1989, pp. 857-858.

* cited by examiner

INDIUM-CONTAINING OXIDE FILM AND PREPARING METHOD THEREOF

CROSS-REFERENCE TO RELATED APPLICATIONS

This application is a continuation application of International Application No. PCT/KR2013/00678 filed Jan. 28, 2013, claiming priority based on Korean Patent Application No. 10-2012-0008340 filed on Jan. 27, 2012, No. 10-2012-0125552 filed on Nov. 7, 2012, and No. 10-2013-0009168 filed on Jan. 28, 2013 in the Korean Intellectual Property Office, the entire disclosure of all of which are incorporated herein by reference for all purposes.

TECHNICAL FIELD

The invention relates to an indium-containing oxide film and a method for forming the same.

BACKGROUND

An indium-containing oxide is transparent and conducts electricity, and thus has been widely used in the industry. Due to a higher conductivity or other advantages, a composite indium oxide film containing indium and other metals or an indium oxide film doped with other elements such as fluorine are commonly used rather than an indium oxide film containing indium only. By way of example, an indium tin oxide (ITO) has been used as an electrode of a liquid crystal display (LCD) for a long time. In recent years, researches for using an oxide (In—Ga—Zn—O, IGZO) containing indium, gallium, and zinc in a transparent thin film transistor have been actively carried out. In addition to Sn, Ga, and Zn, other metals such as Al and Mg, and so on also may be used in a composite oxide film containing indium. Most of ITO films used in the current industry have been prepared by a sputtering method. As described in International Patent Application Publication No. WO2010/024279 (Korean Patent Publication No. 10-2011-0028393), an IGZO film is also generally prepared by a sputtering method.

Chemical vapor deposition (CVD) or atomic layer deposition in which source gases are alternately brought into contact with a substrate has an advantage of being able to form a film having a uniform thickness on an uneven surface.

Elam et al. reported a method for forming $In_2O_3$ and ITO films by atomic layer deposition using cyclopentadienyl indium (CpIn) which is a solid at room temperature [J. W. Elam et al., "Atomic Layer Deposition of $In_2O_3$ Using Cyclopentadienyl Indium: A New Synthetic Route to Transparent Conducting Oxide Films", Chemistry of Materials, Volume 18, p 3571 (2006); J. W. Elam et al., "Atomic Layer Deposition of Indium Tin Oxide Thin Films Using Nonhalogenated Precursors" Journal of Physical Chemistry C, volume 112, p 1938 (2008)]. It is very difficult to vaporize a solid compound and supply it to a large-area substrate at a uniform concentration, and, thus, it is difficult to industrially apply a method for forming $In_2O_3$ and ITO films on a large-area substrate using CpIn as an indium source.

There have been known methods for forming an indium oxide film or an indium-containing oxide film by chemical vapor deposition or atomic layer deposition using other indium compounds instead of CpIn as a source material. Ritala et al. reported a method for forming an indium oxide film or an ITO film by atomic layer deposition using $InCl_3$ and $SnCl_4$ [M. Ritala et al., "Enhanced Growth Rate in Atomic Layer Epitaxy of Indium Oxide and Indium-Tin Oxide Thin Films", Electrochemical and Solid-State Letters, volume 1, p 156 (1998)]. $InCl_3$ is a solid at room temperature, and in order to supply $InCl_3$ in a gaseous state, a source supply unit needs to be heated at a high temperature of 285° C. Ritala et al. also reported a method for forming a conductive indium oxide film, ITO, and an indium oxide film doped with fluorine using $In(hfac)_3$, $In(thd)_3$, and $In(acac)_3$ which are solids at room temperature (hfac=hexafluoropentadionate; thd=2,2,6,6-tetramethyl-3,5-heptanedionate; acac=2,4-pentanedionate) [M. Ritala et al., "ALE Growth of Transparent Conductors", Material Research Society Symposium Proceedings, volume 426, p 513 (1996)]. Nielsen et al. reported a method for forming an indium oxide film by atomic layer deposition using $In(acac)_3$ [O. Nielsen et al., "Thin films of $In_2O_3$ by atomic layer deposition using $In(acac)_3$", Thin Solid Films, volume 517, p 6320 (2009)]. Ott et al. reported a method for forming an indium oxide film using $In(CH_3)_3$ which is a solid at room temperature [A. W. Ott et al., "Surface chemistry of $In_2O_3$ deposition using $In(CH_3)_3$ and $H_2O$ in a binary reaction sequence", Applied Surface Science, volume 112, p 205 (1997)]. Jin Ho Park et al. reported a method for forming an indium oxide film using $[(CH_3)_2In(acac)]_2$ which is a solid at room temperature [J.-H. Park et al., "The X-ray single crystal structure of $[Me_2In(acac)]_2$ and its use as a single-source precursor for the deposition of indium oxide thin films", Journal of Materials Chemistry, volume 11, p 2346 (2001)]. Gaskell and Sheel also reported a method for forming an indium oxide film doped with fluorine using $[(CH_3)_2In(acac)]_2$ [D. W. Sheel and J. M. Gaskell, "Deposition of fluorine doped indium oxide by atmospheric pressure chemical vapour deposition", Thin Solid Films, volume 520, p 1242 (2011)]. Barry et al. reported a method for forming an indium oxide film by chemical vapor deposition using $In[(N^iPr)_2CN(CH_3)_2]_3$ which is a solid at room temperature, as a source material [S. T. Barry et al., "Chemical vapour deposition of $In_2O_3$ thin films from a tris-guanidinate indium precursor", Dalton Transactions, volume 40, p 9425 (2011)].

So far, all of the indium sources used for forming indium oxide films or indium-containing oxide films are solids at room temperature. There has not been known a method for forming an indium oxide film or an indium-containing oxide film by chemical vapor deposition or atomic layer deposition using an indium compound which is a liquid at room temperature. Further, there has not been known an example of forming, via chemical vapor deposition or atomic layer deposition, indium oxide film or indium-containing oxide film having a high conductivity equivalent to that of an indium-containing oxide film formed by a sputtering method so as to be used as a transparent electrode.

A thin film transistor using IGZO is higher in speed than a thin film transistor using a non-crystalline silicon, and, thus, researches for applying it to a large-area LCD panel such as a TV, and so on have been actively carried out. It is necessary to form IGZO by chemical vapor deposition or atomic layer deposition in order to control a composition of an IGZO oxide film, but it is very difficult to form an indium oxide film or indium-containing oxide film on a display glass substrate even larger than 1 meter in width and length using a source material which is a solid at room temperature.

In order to form an IGZO film on a large-area substrate, especially a large-area display substrate which can be applied to a TV, and so on, it is necessary to form an indium oxide film or indium-containing oxide film by chemical vapor deposition or atomic layer deposition using a liquid indium compound. In particular, in the case of using a glass substrate, it is necessary to form an indium oxide film or indium-containing oxide film by chemical vapor deposition or atomic layer deposition using a liquid indium compound at a temperature of 200° C. or less.

DETAILED DESCRIPTION OF THE INVENTION

Problems to be Solved by the Invention

In view of the foregoing problems, one purpose of the present disclosure is to provide a method for forming an indium-containing oxide film on a substrate.

Another purpose of the present disclosure is also to provide a method for forming an indium-containing oxide film on a large-area substrate.

Another purpose of the present disclosure is to provide a method for forming an indium-containing oxide film on a large-area transparent substrate.

Another purpose of the present disclosure is to provide an indium-containing oxide film formed from a gas of an indium compound which is a liquid at room temperature and an oxygen-containing gas: or a substrate on which the indium-containing oxide film is formed.

Another purpose of the present disclosure is to provide an indium-containing oxide film having a high conductivity, or a substrate on which the indium-containing oxide film is formed.

However, problems to be solved by the example embodiments of the present disclosure are not limited to the above-described problems. Although not described herein, other problems to be solved by the present disclosure can be clearly understood by those skilled in the art from the following descriptions.

Means for Solving the Problems

In a first aspect of the present disclosure, there is provided a method for forming an indium-containing oxide film, including: providing a gas of an indium compound which is a liquid at room temperature and an oxygen-containing gas to a substrate to be reacted.

In a second aspect of the present disclosure, there is provided an indium-containing oxide film, formed by reacting a gas of an indium compound which is a liquid at room temperature with an oxygen-containing gas.

In a third aspect of the present disclosure, there is provided a substrate including the indium-containing oxide film in accordance with the second aspect.

Effect of the Invention

Conventional indium compounds used for forming indium-containing oxide films are solids at room temperature, and, thus, in order to supply the indium compounds in a gaseous state when films are prepared, they need to be heated at a high temperature, and it is very difficult to vaporize the solids and supply them to a large-area substrate at a uniform concentration. However, an indium compound of the present disclosure for preparing an indium-containing oxide film is a liquid at room temperature and thus can be easily vaporized and can be supplied to a large-area substrate at a uniform concentration.

By using a method of the present disclosure, an indium-containing oxide film can be easily formed on a substrate. In particular, by using a method of the present disclosure, an indium-containing oxide film having a low resistivity, i.e. having a high conductivity, can be easily formed. An IGZO film as an oxide film containing indium, gallium, and zinc can be used for preparing a transparent thin film transistor in a display device, and an ITO formed as such can be used as a transparent conductive film. Further, by a method of the present disclosure, an indium-containing oxide film can be formed on a large-areas substrate, for example, a large-area glass or polymer substrate. The polymer substrate may be a flexible substrate and can be used in the form of a roll.

BEST MODE FOR CARRYING OUT THE INVENTION

Figure 1:
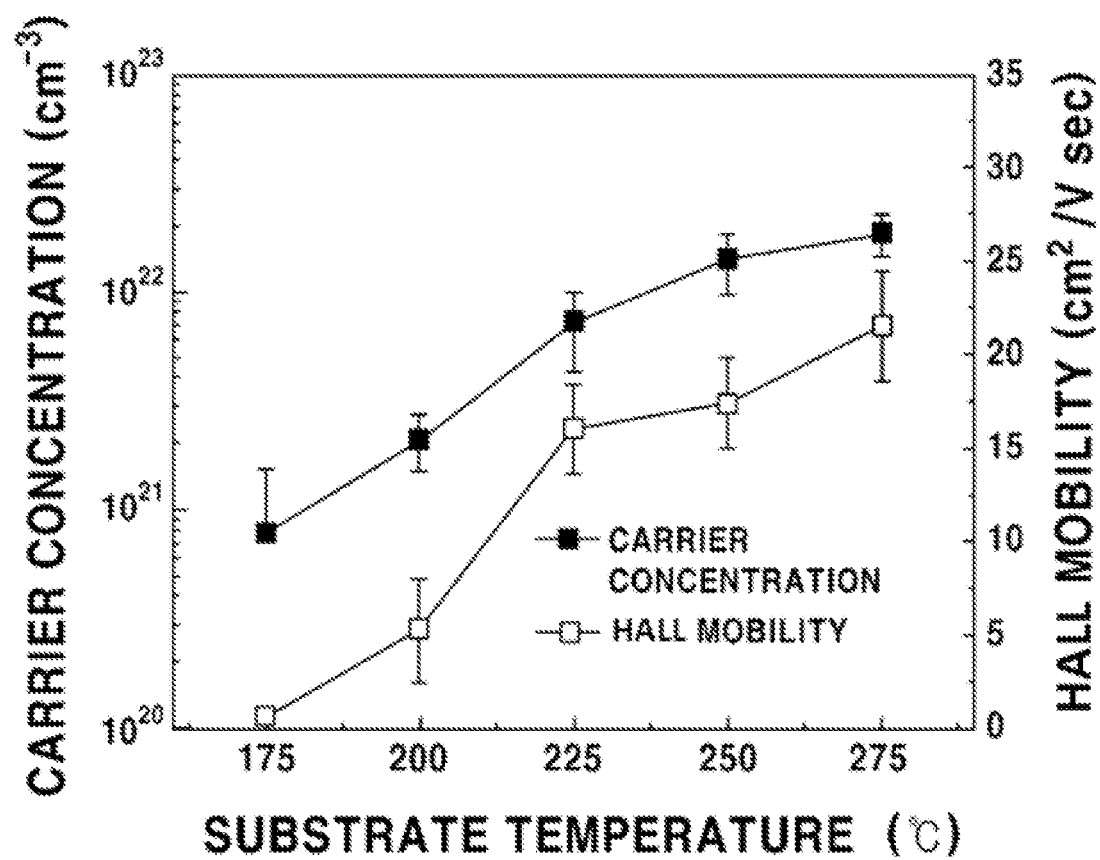
FIG. 1 shows a Hall mobility and a carrier concentration of an indium oxide film in accordance with an example of the present disclosure.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document of the present disclosure.

Through the whole document of the present disclosure, the term "connected to" or "coupled to" that is used to designate a connection or coupling of one element to another element includes both a case that an element is "directly connected or coupled to" another element and a case that an element is "electronically connected or coupled to" another element via still another element.

Through the whole document of the present disclosure, the term "on" that is used to designate a position of one element with respect to another element includes both a case that the one element is adjacent to the another element and a case that any other element exists between these two elements.

Through the whole document of the present disclosure, the term "comprises or includes" and/or "comprising or including" used in the document means that one or more other components, steps, operation and/or existence or addition of elements are not excluded in addition to the described components, steps, operation and/or elements unless context dictates otherwise. The term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document of the present disclosure, the term "combinations of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Hereinafter, a preparing method for forming an indium oxide film of the present disclosure will be explained in detail with reference to embodiments, examples, and drawings. However, the present disclosure is not limited to the following embodiments, examples, and drawings.

In a first aspect of the present disclosure, there is provided a method for forming an indium-containing oxide film, including: providing a gas of an indium compound and an oxygen-containing gas to a substrate to be reacted.

In an example embodiment of the present disclosure, the indium compound may be a liquid at room temperature and may include a member selected from the group consisting of bis(trimethylsilyl)aminodiethylindium [$(CH_3CH_2)_2InN[Si(CH_3)_3]_2$; $Et_2InN(TMS)_2$; herein, TMS means $Si(CH_3)_3$], dimethyl(3-dimethylaminopropyl)indium [$(CH_3)_2In(CH_2)_3N(CH_3)_2$; $Me_2In(CH_2)_3NMe_2$], and combinations thereof which can be easily vaporized, but may not be limited thereto. By way of example, $Et_2InN(TMS)_2$ has a vapor pressure of about 4.5 torr at about 100° C., and $Me_2In(CH_2)_3NMe_2$ has a vapor pressure of about 2.7 torr at about 50° C., and thus they are suitable to be used as a source material in chemical vapor deposition or atomic layer deposition. The above-described indium compounds are liquids at room temperature and thus can be easily vaporized at a relatively low temperature, and they can be provided to a substrate at a uniform concentration and thus can be applied to a large-area substrate.

In an example embodiment of the present disclosure, the oxygen-containing gas may include a gas selected from the group consisting of $H_2O$, $H_2O_2$, $O_2$, $O_3$, and combinations thereof, but may not be limited thereto.

In an example embodiment of the present disclosure, the substrate may be a substrate having a large area, for example, about 1 m or more in width and length, respectively, but may not be limited thereto. By way of example, the substrate having a large area may be about 1 m or more, about 2 m or more, about 3 m or more, about 4 m or more, about 5 m or more, about 6 m or more, about 7 m or more, about 8 m or more, about 9 m or more, or about 10 m or more in width and length, respectively, but may not be limited thereto.

In an example embodiment of the present disclosure, the substrate may be employed from those used in the art without specific limitation. By way of example, the substrate may include a glass, silicon, silicon oxide, or a polymer, but may not be limited thereto.

In an example embodiment of the present disclosure, the substrate may be a glass substrate having a large area, but may not be limited thereto. Further, the substrate may be a substrate containing a polymer, but may not be limited thereto. By way of example, the substrate containing a polymer may have a type winded in the form of a roll as a flexible substrate, but may not be limited thereto. In an example embodiment of the present disclosure, the substrate containing a polymer may be a substrate containing a heat-resistant polymer, but may not be limited thereto. By way of example, the polymer may include a member selected from the group consisting of polyester (PET), polyethylenenapthalate (PEN), polycarbonate (PC), polyetherimide (PEI), polyethersulfone (PES), polyetheretherketon (PEEK), and polyimide, but may not be limited thereto.

In an example embodiment of the present disclosure, the substrate may be maintained at a temperature of from room temperature to about 500° C., for example, from room temperature to about 450° C., from room temperature to about 400° C., from room temperature to about 350° C., from room temperature to about 300° C., from room temperature to about 250° C., from room temperature to about 200° C., from about 50° C. to about 500° C., from about 50° C. to about 450° C., from about 50° C. to about 400° C., from about 50° C. to about 350° C., from about 50° C. to about 300° C., from about 50° C. to about 250° C., from about 50° C. to about 200° C., from about 50° C. to about 150° C., from about 100° C. to about 500° C., from about 100° C. to about 450° C., from about 100° C. to about 400° C., from about 100° C. to about 350° C., from about 100° C. to about 300° C., from about 100° C. to about 250° C., from about 100° C. to about 200° C., from about 100° C. to about 150° C., from about 150° C. to about 500° C., from about 150° C. to about 450° C., from about 150° C. to about 400° C., from about 150° C. to about 350° C., from about 150° C. to about 300° C., from about 150° C. to about 250° C., from about 150° C. to about 200° C., from about 175° C. to about 500° C., from about 175° C. to about 450° C., from about 175° C. to about 400° C., from about 175° C. to about 350° C., from about 175° C. to about 300° C., from about 175° C. to about 250° C., from about 175° C. to about 200° C., from about 200° C. to about 500° C., from about 200° C. to about 450° C., from about 200° C. to about 400° C., from about 200° C. to about 350° C., from about 200° C. to about 300° C., from about 200° C. to about 250° C., from about 225° C. to about 500° C., from about 225° C. to about 450° C., from about 225° C. to about 400° C., from about 225° C. to about 350° C., from about 225° C. to about 300° C., or from about 225° C. to about 250° C., but may not be limited thereto.

By way of example, in the case of using $Et_2InN(TMS)_2$ as the indium compound, the substrate may be maintained at a temperature of from about 175° C. to about 300° C., but may not be limited thereto. By way of example, in the case of using $Me_2In(CH_2)_3NMe_2$ as the indium compound, the substrate may be maintained at a temperature of from about 225° C. to about 300° C., but may not be limited thereto.

In an example embodiment of the present disclosure, a resistivity of the indium-containing oxide film may be at most or less than about $1 \times 10^{-4}$ Ω·cm, for example, at most or less than about $8 \times 10^{-5}$ Ω·cm, at most or less than about $6 \times 10^{-5}$ Ω·cm, at most or less than about $4 \times 10^{-5}$ Ω·cm, at most or less than about $2 \times 10^{-5}$ Ω·cm, at most or less than about $1 \times 10^{-5}$ Ω·cm, at most or less than about $8 \times 10^{-6}$ Ω·cm, at most or less than about $6 \times 10^{-6}$ Ω·cm, at most or less than about $4 \times 10^{-6}$ Ω·cm, at most or less than about $2 \times 10^{-6}$ Ω·cm, or at most or less than about $1 \times 10^{-6}$ Ω·cm, but may not be limited thereto. In an example embodiment of the present disclosure, in the case of using $Et_2InN(TMS)_2$ as the indium compound, a resistivity of the indium-containing oxide film may be about $1.6 \times 10^{-5}$ Ω·cm, in the case of using $Me_2In(CH_2)_3NMe_2$ as the indium compound, a resistivity of the indium-containing oxide film may be about $9.2 \times 10^{-5}$ Ω·cm, but may not be limited thereto. The resistivity of the indium-containing oxide film in accordance with an example embodiment of the present disclosure is decreased by about 50 times or more, about 100 times or more, about 500 times or more, about 1,000 times or more, or about 5,000 times or more as compared with resistivities of indium-containing oxide films prepared using conventional indium compounds, which indicates that a conductivity of the indium-containing oxide film in accordance with an example embodiment of the present disclosure is greatly improved.

In an example embodiment of the present disclosure, the indium-containing oxide film may not include or may not substantially include other elements than indium, oxygen, and carbon, but may not be limited thereto. In another embodiment of the present disclosure, the indium-containing oxide film may not include or may not substantially include other elements than indium, oxygen, and less than 1 at % carbon, but may not be limited thereto.

In an example embodiment of the present disclosure, the indium-containing oxide film may be formed by chemical vapor deposition or atomic layer deposition, but may not be limited thereto. By the chemical vapor deposition or atomic layer deposition, a source in a gaseous state is supplied to a substrate, and, thus, a film having a uniform thickness can be formed on an uneven surface, and the source gas is supplied at a uniform concentration to a large-area substrate or a substrate in the form of a roll, and, thus, a uniform film can be formed. In the case of using the atomic layer deposition, a typical time division atomic layer deposition apparatus configured to supply each source gas in sequence may be used. Otherwise, there may be used a space division atomic layer deposition apparatus with reciprocating manner of a substrate between a region where one kind of a source gas needed for atomic layer deposition is filled and a region where another kind of a source gas is filled. If the substrate is a polymer substrate in the form of a roll, there may be used a roll-to-roll chemical vapor deposition apparatus or a roll-to-roll atomic layer deposition apparatus configured to unwind the roll to expose a surface of the substrate and then rewind in form of the roll on which a film is formed. The chemical vapor deposition or atomic layer deposition may be plasma enhanced chemical vapor deposition (PECVD) or plasma enhanced atomic layer deposition (PEALD) using plasma, but may not be limited thereto. Generally, plasma enhanced chemical vapor deposition or plasma enhanced atomic layer deposition has an advantage of being able to form a high-quality film at a lower film formation temperature as compared with the methods without using plasma.

In a second aspect of the present disclosure, there is provided an indium-containing oxide film, formed by reacting a gas of an indium compound which is a liquid at room temperature, with an oxygen-containing gas.

In an example embodiment of the present disclosure, the indium compound may include a member selected from the group consisting of $Et_2InN(TMS)_2$, $Me_2In(CH_2)_3NMe_2$, and combinations thereof, but may not be limited thereto.

In an example embodiment of the present disclosure, the oxygen-containing gas may include a gas selected from the group consisting of $H_2O$, $H_2O_2$, $O_2$, $O_3$, and combinations thereof, but may not be limited thereto.

In an example embodiment of the present disclosure, a resistivity of the indium-containing oxide film is at most or less than about $1 \times 10^{-4}$ $\Omega \cdot cm$, for example, at most or less than about $8 \times 10^{-5}$ $\Omega \cdot cm$, at most or less than about $6 \times 10^{-5}$ $\Omega \cdot cm$, at most or less than about $4 \times 10^{-5}$ $\Omega \cdot cm$, at most or less than about $2 \times 10^{-5}$ $\Omega \cdot cm$, at most or less than about $1 \times 10^{-5}$ $\Omega \cdot cm$, at most or less than about $8 \times 10^{-6}$ $\Omega \cdot cm$, at most or less than about $6 \times 10^{-6}$ $\Omega \cdot cm$, at most or less than about $4 \times 10^{-6}$ $\Omega \cdot cm$, at most or less than about $2 \times 10^{-6}$ $\Omega \cdot cm$, or at most or less than about $1 \times 10^{-6}$ $\Omega \cdot cm$, but may not be limited thereto. In an example embodiment of the present disclosure, in the case of using $Et_2InN(TMS)_2$ as the indium compound, a resistivity of the indium-containing oxide film may be about $1.6 \times 10^{-5}$ $\Omega \cdot cm$, in the case of using $Me_2In(CH_2)_3NMe_2$ as the indium compound, a resistivity of the indium-containing oxide film may be about $9.2 \times 10^{-5}$ $\Omega \cdot cm$, but may not be limited thereto. A value of the resistivity of the indium-containing oxide film in accordance with an example embodiment of the present disclosure is decreased by about 50 times or more, about 100 times or more, about 500 times or more, about 1,000 times or more, or about 5,000 times or more as compared with resistivities of indium-containing oxide films formed using conventional indium compounds, which indicates that a conductivity of the indium-containing oxide film in accordance with an example embodiment of the present disclosure is greatly improved.

In an example embodiment of the present disclosure, the indium-containing oxide film may not include or may not substantially include other elements than indium, oxygen, and carbon, but may not be limited thereto. In another embodiment, the indium-containing oxide film may not include or may not substantially include other elements than indium, oxygen, and less than 1 at % carbon, but may not be limited thereto.

In an example embodiment of the present disclosure, the indium-containing oxide film may be formed by chemical vapor deposition or atomic layer deposition, but may not be limited thereto.

In an example embodiment of the present disclosure, the substrate may include a glass, silicon, silicon oxide, or a polymer, but may not be limited thereto.

The indium-containing oxide film in accordance with the second aspect of the present disclosure may include all of described contents regarding the method for forming the indium-containing oxide film in accordance with the first aspect of the present disclosure, but it is omitted for convenience.

In a third aspect of the present disclosure, there is provided a substrate including the indium-containing oxide film in accordance with the second aspect.

MODE FOR CARRYING OUT THE INVENTION

Hereinafter, the present disclosure will be explained in detail with reference to examples. However, the present disclosure is not limited thereto.

EXAMPLE

Example 1

Figure 2:
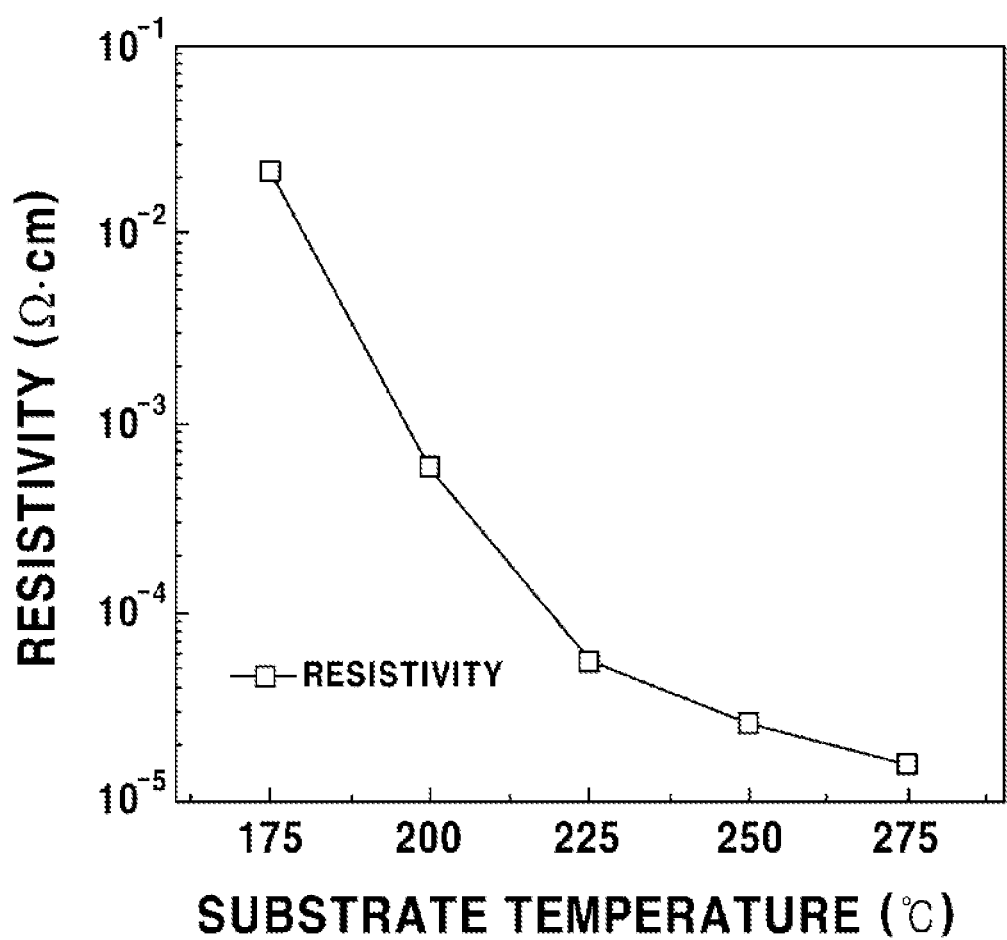
FIG. 2 shows a resistivity of an indium oxide film in accordance with an example of the present disclosure.

Formation of Indium Oxide Film by Atomic Layer Deposition Using $Et_2InN(TMS)_2$ A gas of $Et_2InN(TMS)_2$ which is a liquid at room temperature, and $H_2O$ gas were alternately brought into contact with a substrate. In the present example, each of a silicon substrate and a silicon substrate on which a silicon oxide film is formed was used. The both substrates had the same film growth rate per atomic layer deposition gas supply cycle. The substrate was maintained at a temperature of from 100° C. to 275° C. $Et_2InN(TMS)_2$ was vaporized at a temperature of from 30° C. to 60° C. By using a typical time division atomic layer deposition apparatus, the gas of $Et_2InN(TMS)_2$, an inert gas, $H_2O$ gas, and an inert gas were repeatedly supplied in sequence for 1 second, 10 seconds, 1 second, and 10 seconds, respectively, to a region where the substrate was placed. The inert gas may be employed from those known in the art, such as $N_2$ gas, Ar gas, He gas, or combined gases thereof. In the present example, Ar gas was used as the inert gas. In the temperature range of the substrate from 175° C. to 225° C., even when a supplied amount of $Et_2InN(TMS)_2$ was increased, a film growth rate per atomic layer deposition gas supply cycle (growth-per-cycle, GPC) was constant in the range of from 0.067 nm/cycle to 0.069 nm/cycle. On the silicon oxide film substrate heated at temperatures of 175° C., 200° C., 225° C., 250° C., and 275° C., an indium oxide film was formed to a thickness of from about 30 nm to about 35 nm, and a Hall mobility, a carrier concentration, and a resistivity were obtained by measuring a Hall effect as shown in FIG. 1 and FIG. 2. In the present example, a resistivity of the indium oxide film formed at 275° C. was $1.6\times10^{-5}$ $\Omega\cdot$cm, which means a high conductivity equivalent to that of a commonly used transparent electrode formed by a conventional sputtering method. As a result analyzed by X-ray photoelectron spectroscopy (XPS), 4.3 at % carbon was detected from the indium oxide film formed at 175° C. in addition to indium and oxygen, and 0.3 at % carbon was detected from the indium oxide film formed at 200° C. in addition to indium and oxygen. No carbon was detected from the indium oxide films formed at 250° C. and 275° C. respectively.

Example 2

Formation of Indium Oxide Film by Atomic Layer Deposition Using $Me_2In(CH_2)_3NMe_2$ A gas of $Me_2In(CH_2)_3NMe_2$ which is a liquid at room temperature, and $H_2O$ gas were brought into contact with a substrate. In the present example, each of a silicon substrate and a silicon substrate on which a silicon oxide film is formed was used. The both substrates had the same film growth rate per atomic layer deposition gas supply cycle. The substrate was maintained at a temperature of from 100° C. to 275° C. $Me_2In(CH_2)_3NMe_2$ was vaporized at room temperature. By using a typical time division atomic layer deposition apparatus, the gas of $Et_2InN(TMS)_2$, an inert gas, a $H_2O$ gas, and an inert gas were repeatedly supplied in sequence for 1 second, 10 seconds, 1 second, and 10 seconds, respectively, to a region where the substrate was placed. The inert gas may be employed from those known in the art, such as $N_2$ gas, Ar gas, He gas, or combinations thereof. In the present example, an Ar gas was used as the inert gas. At the temperature of the substrate of 275° C., even when a supplied amount of the $Me_2In(CH_2)_3NMe_2$ was increased, a film growth rate per atomic layer deposition gas supply cycle (growth-per-cycle, GPC) was constant at 0.059 nm/cycle. At a temperature of the substrate of 225° C. or less, an indium oxide film was hardly formed (GPC<0.01 nm/cycle). As a result of measurement of a Hall effect of the indium oxide film formed on the silicon oxide film heated at a temperature of 275° C., a resistivity was $9.2\times10^{-5}$ $\Omega\cdot$cm, a Hall mobility was 0.35 $cm^2/V\cdot sec$, and a carrier concentration was $1.7\times10^{23}$.

Example 3

Formation of IGZO Film by Atomic Layer Deposition Using $Et_2InN(TMS)_2$ $Et_2InN(TMS)_2$ gas, trimethylgallium (TMG) gas, diethylzinc (DEZ) gas, and $H_2O$ gas were alternately brought into contact with a substrate. The substrate was maintained at a temperature of from room temperature to 500° C. or less, more preferably from 50° C. to 200° C. or less, and still more preferably from 50° C. to 150° C. In an IGZO film grown by regulating the order and the ratio of a Gas supply cycle 1 in which $Et_2InN(TMS)_2$ gas, an inert gas, $H_2O$ gas, and an inert gas are brought into contact in sequence with the substrate; a Gas supply cycle 2 in which TMG gas, an inert gas, $H_2O$ gas, and an inert gas are brought into contact in sequence with the substrate; and a Gas supply cycle 3 in which DEZ gas, an inert gas, $H_2O$ gas, and an inert gas are brought into contact in sequence with the substrate, a metal ratio can be regulated. By way of example, the IGZO film formed by repeating a super cycle of the Gas supply cycle 1-Gas supply cycle 2-Gas supply cycle 1-Gas supply cycle 3 is higher in In content than that of the IGZO film formed by repeating a super cycle of the Gas supply cycle 1-Gas supply cycle 2-Gas supply cycle 3 was. As the substrate, any one of those known in the art, such as a glass, silicon, or a polymer may be used. The inert gas may be employed from those known in the art, such as $N_2$ gas, Ar gas, He gas, or combinations thereof. Instead of the $H_2O$ gas, a $H_2O_2$ gas, an oxygen ($O_2$) gas, and an ozone ($O_3$) gas may be used as oxygen sources for forming an oxide.

Example 4

Formation of Indium Oxide Film by Chemical Vapor Deposition Using $Et_2InN(TMS)_2$ $Et_2InN(TMS)_2$ gas and $H_2O$ gas were simultaneously supplied to a substrate so as to form an indium oxide film on the substrate. The substrate can be maintained at a temperature of from room temperature to 500° C. or less, more preferably from 50° C. to 200° C. or less, and still more preferably from 50° C. to 150° C. After a temperature of the substrate was set, $Et_2InN(TMS)_2$ gas was supplied using a carrier gas in a chemical vapor deposition apparatus where the substrate was placed, and at the same time, $H_2O$ gas was supplied. The carrier gas may be employed from those known in the industry, such as $N_2$ gas, Ar gas, He gas, or combinations thereof. As the substrate, any one of those known in the industry, such as a glass or silicon may be used. The inert gas may be employed from those known in the industry, such as $N_2$ gas, Ar gas, He gas, or combined gases thereof. Instead of the $H_2O$ gas, a $H_2O_2$ gas, an oxygen ($O_2$) gas, and an ozone ($O_3$) gas may be used as oxygen sources for forming an oxide.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method for forming an indium-containing oxide film comprising:
    providing an oxygen-containing gas and an indium compound in a gas state to a substrate to be reacted;
    wherein the indium compound is a liquid at room temperature and includes bis(trimethylsilyl)aminodiethylindium.

2. The method for forming the indium-containing oxide film of claim 1, wherein a resistivity of the indium-containing oxide film is $1\times10^{-4}$ $\Omega\cdot$cm or less.

3. The method for forming the indium-containing oxide film of claim 2, wherein the resistivity of the indium-containing oxide film is $2\times10^{-5}$ Ω·cm.

4. The method for forming the indium-containing oxide film of claim 1, wherein the substrate is maintained at a temperature of from room temperature to 500° C.

5. The method for forming the indium-containing oxide film of claim 1, wherein the substrate is maintained at a temperature of from 175° C. to 300° C.

6. The method for forming the indium-containing oxide film of claim 1, wherein the substrate is maintained at a temperature of from 225° C. to 300° C.

7. The method for forming the indium-containing oxide film of claim 1, wherein the indium-containing oxide film is formed by chemical vapor deposition or atomic layer deposition.

8. The method for forming the indium-containing oxide film of claim 1, wherein the oxygen-containing gas includes a gas selected from the group consisting of $H_2O$, $H_2O_2$, $O_2$, $O_3$, and combinations thereof.

9. The method for forming the indium-containing oxide film of claim 1, wherein the substrate includes a glass, silicon, silicon oxide, or a polymer.

10. The method for forming the indium-containing oxide film of claim 1, wherein the indium-containing oxide film does not include an element other than indium, oxygen, and carbon.

* * * * *